United States Patent
LaRoche et al.

(10) Patent No.: US 7,557,378 B2
(45) Date of Patent: Jul. 7, 2009

(54) BORON ALUMINUM NITRIDE DIAMOND HETEROSTRUCTURE

(75) Inventors: Jeffrey R. LaRoche, Tewksbury, MA (US); William E. Hoke, Wayland, MA (US); Steven D. Bernstein, Brighton, MA (US); Ralph Korenstein, Framingham, MA (US)

(73) Assignee: Raytheon Company, Waltham, MA (US)

( * ) Notice: Subject to any disclaimer, the term of this patent is extended or adjusted under 35 U.S.C. 154(b) by 139 days.

(21) Appl. No.: 11/557,514

(22) Filed: Nov. 8, 2006

(65) Prior Publication Data

US 2008/0121897 A1     May 29, 2008

(51) Int. Cl.
*H01L 29/04*     (2006.01)
(52) U.S. Cl. ............... 257/77; 257/78; 257/192; 257/194; 257/E21.005; 257/E21.041; 257/E21.049; 257/E21.27; 257/E21.323; 257/E29.246; 257/E29.248; 257/E29.249
(58) Field of Classification Search ......... None
See application file for complete search history.

(56) References Cited

U.S. PATENT DOCUMENTS 5,766,783 A * 6/1998 Utsumi et al. ........... 428/698
5,903,015 A * 5/1999 Shiomi et al. ........... 257/77
2005/0139838 A1  6/2005 Murata et al.
2006/0054926 A1  3/2006 Lahreche

OTHER PUBLICATIONS

Miskys, C.R. et al "AlN/diamond heterojuction diodes" Applied Physics Letters 82 (2003): 290-292.*
PCT/US2007/022325 International Search Report dated Apr. 10, 2008.
C.R. Miskys, AlN/diamond heterojunction diodes, Oct. 31, 2002, pp. 290-292.
A.Y. Polyakov, Growth of AlBN Solid Solutions by Organometallic Vapor-Phase Epitaxy, Nov. 11, 1996, pp. 1715-1719.
A. Vescan, High-Temperature, High-Voltage Operation of Pulse-Doped Diamond MESFET, vol. 18, No. 5, May 1997, pp. 222-224.
J.H. Edgar, c-Boron-Aluminum Nitride Alloys Prepared by Ion-Beam Assisted Deposition, 1997, pp. 33-38.

* cited by examiner

*Primary Examiner*—Minh-Loan T Tran
*Assistant Examiner*—Fei Fei Yeung Lopez
(74) *Attorney, Agent, or Firm*—Daly, Crowley, Mofford & Durkee, LLP

(57) ABSTRACT

A heterostructure having a heterojunction comprising: a diamond layer; and a boron aluminum nitride $(B_{(x)}Al_{(1-x)}N)$ layer disposed in contact with a surface of the diamond layer, where x is between 0 and 1.

5 Claims, 3 Drawing Sheets

BORON ALUMINUM NITRIDE DIAMOND HETEROSTRUCTURE

TECHNICAL FIELD

This invention relates generally to heterojunction and more particularly to diamond heterojunctions.

BACKGROUND

As is known in the art, a heterostructure is a semiconductor junction having layers of dissimilar semiconductor material with unequal bandgaps and wherein carriers generated in one material fall into a quantum well or channel layer provided by the other material. As is also known in the art, over the last decade there has been considerable effort to develop semiconductors devices having gallium nitride (GaN) based channel layers electronics owing to GaN's high mobility, saturation velocity, breakdown field, chemical and thermal stability, and large band gap. These factors lead to power densities 10× that of gallium arsenide (GaAs) based devices, and make GaN the primary candidate for many power electronics applications. However, as military and commercial applications demand ever-higher power densities and operating temperatures, there becomes a need to explore new material systems that could satisfy these requirements. Diamond has the potential to be the material of choice for the next generation of power devices.

Diamond is comparable to or better than GaN in almost every category. Specifically, its electron and hole mobilities, band gap, breakdown voltage and thermal conductivity exceed that of GaN. In particular, the thermal conductivity of diamond (6-20 W cm$^{-1 \circ}$ C.$^{-1}$) is also noteworthy. At a typical output power density of 5 W/mm, the performance of GaN HEMTs is thermally degraded on current substrates even when grown on SiC (thermal conductivity of 3.6-4.9 W cm$^{-1 \circ}$ C.$^{-1}$ depending on polytype). However, the development of diamond based devices has been limited by the difficulty in growing single crystal diamond films or substrates, by the difficulty in growing n-type diamond, and the lack of heterojunctions with two dimensional gas confinement (2D gas) for high electron mobility transistor (HEMT) fabrication,

SUMMARY

In accordance with the invention, an aluminum nitride diamond heterojunction is provided.

In one embodiment, the aluminum nitride is doped.

In one embodiment, a boron aluminum nitride ($B_{(x)}Al_{(1-x)}N$) diamond heterojunction where x is between 0 and 1 is provided.

In one embodiment, a heterostructure is provided having a heterojunction comprising: a diamond layer; and a boron aluminum nitride ($B_{(x)}Al_{(1-x)}N$) layer disposed in contact with a surface of the diamond layer, where x is between 0 and 1.

In one embodiment, the surface of the diamond layer has a (111) crystallographic orientation.

In one embodiment, the AlN is hexagonal AlN.

In one embodiment, the Boron is alloyed into the AlN.

In one embodiment, a boron aluminum nitride ($B_{(x)}Al_{(1-x)}N$) diamond heterojunction where x is between 0 and 1 is provided wherein the $B_{(x)}Al_{(1-x)}N$ is doped with donors to provide carriers to the diamond In one embodiment, a boron aluminum nitride ($B_{(x)}Al_{(1-x)}N$) diamond heterojunction where x is between 0 and 1 is provided wherein the diamond is pulse doped to provide carriers.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
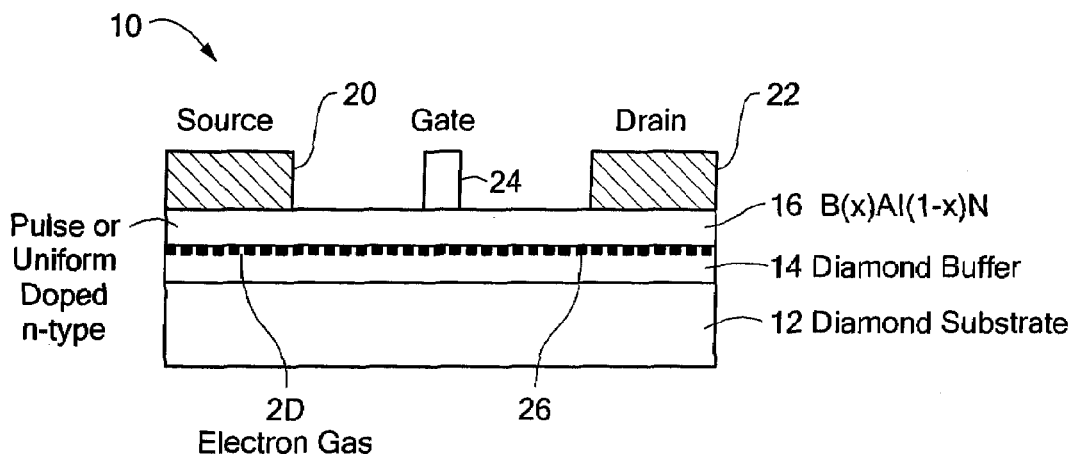
FIG. 1 is a cross-sectional sketch of a B(x)Al(1-x)N/Diamond high electron mobility transistor (HEMT) formed on a diamond substrate with two dimensional (2D) localizations of electrons in the diamond according to the invention.

Referring now to FIG. 1, a $B_{(x)}Al_{(1-x)}N$/Diamond heterojunction structure 10, here a high electron mobility transistor (HEMT), is shown formed on a diamond substrate 12 where x is between 0 and 1. More particularly, a diamond buffer layer 14 is formed on the diamond substrate 12, here with the surface of the diamond substrate 12 preferably having a (111) crystallographic orientation. A $B_{(x)}Al_{(1-x)}N$ layer 16 is grown epitaxially using plasma molecular beam epitaxy (MBE) on the surface of the diamond buffer layer preferably having a (111) crystallographic orientation to form a heterojunction with the diamond buffer layer 14. Source and drain contacts 20, 22, here for example Ti/Al/Pt/Au, are formed in ohmic contact with the $B_{(x)}Al_{(1-x)}N$ layer and a gate contact 24, here for example Ni/Pt/Au, is formed in Schottky contact with the $B_{(x)}Al_{(1-x)}N$ layer 14. Here the structure has two dimensional (2D) localizations of electrons 26 in the diamond buffer layer 14 (i.e., the diamond buffer layer provides the channel layer which provides a quantum well for the carriers in close proximity to the B(x)Al(1-x)N/heterojunction.

It should be noted that the relative values of the bandgaps for the $B_{(x)}Al_{(1-x)}N$/Diamond heterostructure 10 are useful in order to understand the HEMT structure of FIG. 1 where the 2D gas is localized in the smaller bandgap diamond part of the device. However, more important are the conduction and valence band offsets that occur at the $B_{(x)}Al_{(1-x)}N$/Diamond interface. For example, in an n-type HEMT structure the conduction band offset localizes the carriers into a two dimensional gas (2D gas) of electrons that enhances the mobility of the device. Also, in the n-type structure, the valence band offset helps to suppress gate leakage current due to impact ionization generation of holes (important in power devices). For the p-type device the roles of the band offsets are reversed. The valence offset band would localize the 2D gas of holes, while the conduction band offset would confine electrons generated during impact ionization. Furthermore the size of the conduction (valence) band discontinuity partly determines the concentration of free carriers in the 2-Dimensional gas and thus directly impacts the current of the device. For AlN/Diamond heterostructures (x=0) the conduction band offset is only ~0.2 ev, while the valence band offset is about ~0.53 ev. A p-type HEMT should be possible, while an n-type HEMT would have low current due to the small conduction band offset. Another concern, which is discussed later, is that this conduction band offset could be reduced further (or even eliminated) by strain induced by lattice mismatch between the $B_{(x)}Al_{(1-x)}N$ and Diamond.

The conduction band and valence band discontinuities (and thus increase the device current and power) are increased by alloying Boron into AlN. Although BN is an indirect semiconductor, it has a large direct bandgap. By alloying Boron into AlN, the ternary bandgap (which for small Boron concentrations will be direct) will increase until the material becomes indirect. After the material becomes indirect, the bandgap will decrease with additional boron incorporation (due to the small indirect k valley bandgap of BN). In table below, the band gaps of the different $B_{(x)}Al_{(1-x)}N$ valleys based on composition are calculated. The desirable direct bandgap is the Gamma Valley. On the left, the minimum band gaps by composition, but not including bowing are highlighted. To the right, the bowing band gaps are calculated assuming first a bow parameter of 1, and then a parameter of 3. These parameters were assumed based on AlGaN (bow parameter of 1) and InAlN (bow parameter of 3) because the bow parameter for $B_{(x)}Al_{(1-x)}N$ is not known. Below the top set of data is another set of data. The difference between the two sets is that they assume different band gaps for the K valley in BN because the quoted range was 4.5-5.5 eV. The top set of data is 4.5 eV (worst case scenario), the bottom set is 5.5 eV (best case scenario). These calculations were based on the wurtzite crystal structure for $B_{(x)}Al_{(1-x)}N$. To summarize, the largest band gap is at 20-25% BN concentration. Without including conduction band bowing, the maximum bandgap is ~6.77 eV. By including conduction band bowing, the maximum values range from ~6.2-6.6 eV. Therefore in most cases the bandgap and the conduction and valence band discontinuities with diamond are increased by alloying boron into AlN, increasing the current density and confinement capability of the structure. If other crystal structures are used in these calculations, the numbers will be different but the concepts put forward herein will be the same.

The band gaps of the different B(x)Al(1-x)N valleys based on composition. The best (bottom) and worst case scenario (top) are presented. The compositions of boron blocked out are the approximate direct to indirect valley cross over compositions.

B(x)Al(1-x)N Band Gap Calculations

Diamond Band Gap is ~5.47 ev

| | NO Conduction Band Bowing | | | Assming A Bow Factor 1 | | | Assming A Bow Factor 3 | | |
|---|---|---|---|---|---|---|---|---|---|
| B(X) Comp | Direct Valley Gamma | Indirect Valley K | Indirect Valley M-L | Direct Valley Gamma | Indirect Valley K | Indirect Valley M-L | Direct Valley Gamma | Indirect Valley K | Indirect Valley M-L |
| | Worst Case Scenario Assuming K Valley in BN only 4.5 eV | | | | | | | | |
| 1 | 8.5 | 4.5 | 6.6 | 8.5 | 4.5 | 6.6 | 8.5 | 4.5 | 6.6 |
| 0.95 | 8.385 | 4.635 | 6.615 | 8.3375 | 4.5875 | 6.5675 | 8.2425 | 4.4925 | 6.4725 |
| 0.9 | 8.27 | 4.77 | 6.63 | 8.18 | 4.68 | 6.54 | 8 | 4.5 | 6.36 |
| 0.85 | 8.155 | 4.905 | 6.645 | 8.0275 | 4.7775 | 6.5175 | 7.7725 | 4.5225 | 6.2625 |
| 0.8 | 8.04 | 5.04 | 6.66 | 7.88 | 4.88 | 6.5 | 7.56 | 4.56 | 6.18 |
| 0.75 | 7.925 | 5.175 | 6.675 | 7.7375 | 4.9875 | 6.4875 | 7.3625 | 4.6125 | 6.1125 |
| 0.7 | 7.81 | 5.31 | 6.69 | 7.6 | 5.1 | 6.48 | 7.18 | 4.68 | 6.06 |
| 0.65 | 7.695 | 5.445 | 6.705 | 7.4675 | 5.2175 | 6.4775 | 7.0125 | 4.7625 | 6.0225 |
| 0.6 | 7.58 | 5.58 | 6.72 | 7.34 | 5.34 | 6.48 | 6.86 | 4.86 | 6 |
| 0.55 | 7.465 | 5.715 | 6.735 | 7.2175 | 5.4675 | 6.4875 | 6.7225 | 4.9725 | 5.9925 |
| 0.5 | 7.35 | 5.85 | 6.75 | 7.1 | 5.6 | 6.5 | 6.6 | 5.1 | 6 |
| 0.45 | 7.235 | 5.985 | 6.765 | 6.9875 | 5.7375 | 6.5175 | 6.4925 | 5.2425 | 6.0225 |
| 0.4 | 7.12 | 6.12 | 6.78 | 6.88 | 5.88 | 6.54 | 6.4 | 5.4 | 6.06 |
| 0.35 | 7.005 | 6.255 | 6.795 | 6.7775 | 6.0275 | 6.5675 | 6.3225 | 5.5725 | 6.1125 |
| 0.3 | 6.89 | 6.39 | 6.81 | 6.88 | 6.18 | 6.6 | 6.26 | 5.76 | 6.18 |
| 0.25 | 6.775 | 6.525 | 6.825 | 6.5875 | 6.3375 | 6.6375 | 6.2125 | 5.9625 | 6.2625 |
| 0.2 | 6.66 | 6.66 | 6.84 | 6.5 | 6.5 | 6.68 | 6.18 | 6.18 | 6.36 |
| 0.15 | 6.545 | 6.795 | 6.855 | 6.4175 | 6.6675 | 6.7275 | 6.1625 | 6.4125 | 6.4725 |
| 0.1 | 6.43 | 6.93 | 6.87 | 6.34 | 6.84 | 6.78 | 6.16 | 6.66 | 6.6 |
| 0.05 | 6.315 | 7.065 | 6.885 | 6.2675 | 7.0175 | 6.8375 | 6.1725 | 6.9225 | 6.7425 |
| 0 | 6.2 | 7.2 | 6.9 | 6.2 | 7.2 | 6.9 | 6.2 | 7.2 | 6.9 |
| | Best Case Scenario Assuming K Valley in BN 5.5 eV | | | | | | | | |
| 1 | 8.5 | 5.5 | 6.6 | 8.5 | 5.5 | 6.6 | 8.5 | 5.5 | 6.6 |
| 0.95 | 8.385 | 5.585 | 6.615 | 8.3375 | 5.5375 | 6.5675 | 8.2425 | 5.4425 | 6.4725 |
| 0.9 | 8.27 | 5.67 | 6.63 | 8.18 | 5.58 | 6.54 | 8 | 5.4 | 6.36 |
| 0.85 | 8.155 | 5.755 | 6.645 | 8.0275 | 5.6275 | 6.5175 | 7.7725 | 5.3725 | 6.2625 |

-continued

| | NO Conduction Band Bowing | | | Assming A Bow Factor 1 | | | Assming A Bow Factor 3 | | |
|---|---|---|---|---|---|---|---|---|---|
| B(X) Comp | Direct Valley Gamma | Indirect Valley K | Indirect Valley M-L | Direct Valley Gamma | Indirect Valley K | Indirect Valley M-L | Direct Valley Gamma | Indirect Valley K | Indirect Valley M-L |
| 0.8 | 8.04 | 5.84 | 6.66 | 7.88 | 5.68 | 6.5 | 7.56 | 5.36 | 6.18 |
| 0.75 | 7.925 | 5.925 | 6.875 | 7.7375 | 5.7375 | 6.4875 | 7.3625 | 5.3625 | 6.1125 |
| 0.7 | 7.81 | 6.01 | 6.69 | 7.6 | 5.8 | 6.48 | 7.18 | 5.38 | 6.06 |
| 0.65 | 7.695 | 6.095 | 6.705 | 7.4675 | 5.8675 | 6.775 | 7.0125 | 5.4125 | 6.0225 |
| 0.6 | 7.58 | 6.18 | 6.72 | 7.34 | 5.94 | 6.48 | 6.86 | 5.46 | 6 |
| 0.55 | 7.465 | 6.265 | 6.735 | 7.2175 | 6.0175 | 6.4875 | 6.7225 | 5.5225 | 6.9925 |
| 0.5 | 7.35 | 6.35 | 6.75 | 7.1 | 6.1 | 6.5 | 6.6 | 5.6 | 6 |
| 0.45 | 7.235 | 6.435 | 6.765 | 6.9875 | 6.1875 | 6.5175 | 6.4925 | 5.6925 | 6.0225 |
| 0.4 | 7.12 | 6.52 | 6.78 | 6.88 | 6.28 | 6.54 | 6.4 | 5.8 | 6.06 |
| 0.35 | 7.005 | 6.605 | 6.795 | 6.7775 | 6.3775 | 6.5675 | 6.3225 | 5.9225 | 6.1125 |
| 0.3 | 6.89 | 6.69 | 6.81 | 6.68 | 6.48 | 6.6 | 6.26 | 6.06 | 6.18 |
| 0.25 | 6.775 | 6.775 | 6.825 | 6.5875 | 6.5875 | 6.6375 | 6.2125 | 6.2125 | 6.2625 |
| 0.2 | 6.66 | 8.86 | 6.84 | 6.5 | 6.7 | 6.68 | 6.18 | 6.38 | 6.36 |
| 0.15 | 6.545 | 6.945 | 6.855 | 6.4175 | 6.8175 | 6.7275 | 6.1625 | 6.5625 | 6.4725 |
| 0.1 | 6.43 | 7.03 | 6.87 | 6.34 | 6.94 | 6.78 | 6.16 | 6.76 | 6.6 |
| 0.05 | 6.315 | 7.115 | 6.885 | 6.2675 | 7.0675 | 6.8375 | 6.1725 | 6.9725 | 6.7425 |
| 0 | 6.2 | 7.2 | 6.9 | 6.2 | 7.2 | 6.9 | 6.2 | 7.2 | 6.9 |

The growth of a $B_{(x)}Al_{(1-x)}N$/Diamond heterostructure of hexagonal AlN on cubic (100) diamond would be problematic for several reasons. In addition to the large mismatch, growing hexagonal films on a cubic structure will cause a significant number of defects at the AlN/Diamond interface, degrading the HEMT device structure. Instead here the boron aluminum nitride ($B_{(x)}Al_{(1-x)}N$) is more favorably grown on (111) Diamond. There are several benefits of this. First, the orientation of the carbon atoms in diamond appears as a hexagonal lattice. Consequently growth on a hexagonal material on a hexagonal substrate which would minimize defect formation at the critical interface of $B_{(x)}Al_{(1-x)}N$/Diamond. Second, the effective diamond lattice constant of the hexagonal net of carbon atoms becomes A/(square root of 2)=2.52 Angstroms (where A is the lattice constant of diamond). This lattice constant is less than $B_{(x)}Al_{(1-x)}N$. As a result, $B_{(x)}Al_{(1-x)}N$ should experience biaxial compressive strain when grown on (111) diamond. Compressive strain on the BAlN from the diamond substrate will have the effect of increasing the bandgap of $B_{(x)}Al_{(1-x)}N$ rather than decreasing it as biaxial tensile strain on $B_{(x)}Al_{(1-x)}N$ would cause. Finally, it should be noted that adding boron into AlN not only increases the bandgap, but also slightly reduces the lattice mismatch with diamond by making the ternary lattice constant smaller.

A final consideration in employing the (111) orientation is that AlN and consequently BAlN exhibits a large piezoelectric effect and spontaneous polarization. These properties have been exploited in GaN HEMTs to achieve high device currents without doping. The (111) orientation maximizes the effects. Consequently another approach to overcoming doping difficulties in the BAlN/diamond HEMT structure is to exploit the piezoelectric effect and spontaneous polarization.

Now that the heterostructure has been established, the method of providing electrons and holes for n and p type HEMT devices must be established. In the literature, it has been shown that diamond can be doped p-type by boron to very high levels ($1*10^{19}/cm^3$), however reliable n type doping for single crystal diamond has remained elusive. Since the $B_{(x)}Al_{(1-x)}N$ can be doped with donors, here the $B_{(x)}Al_{(1-x)}N$ is doped n-type and used to provide carriers to the Diamond 2D gas in n-type HEMT device structures. Conversely (since $B_{(x)}Al_{(1-x)}N$ is difficult to be doped p-type) pulse doping of the diamond p-type is used to provide carriers to the channel in some p-type device structures. Taking advantage of the piezo-electric effect of $B_{(x)}Al_{(1-x)}N$ grown on certain crystal orientations of diamond should provide n-type or p-type carries to the 2D gas diamond channel in this HEMT. This alternative method may reduce or eliminate the need for doping in these structures. This same piezoelectric effect is responsible for the carries found in undoped AlGaN/GaN HEMT structures.

With the basic methodology established, several variations on this $B_{(x)}Al_{(1-x)}N$/Diamond device structure are defined. These variations are located below in FIGS. 2-7 (not drawn to scale). For the purposes of discussion these devices are all assumed n-type, however, p-type devices from these structures are also possible. In FIGS. 1-7, it can be seen that in addition to HEMTs fabricated on diamond substrates that HEMT structures on substrates other than diamond. For example growing diamond on AlN substrates, or AlN/SiC substrates. The primary advantage is that such substrates are available in large substrate sizes and are more economical than diamond.

Figure 2:
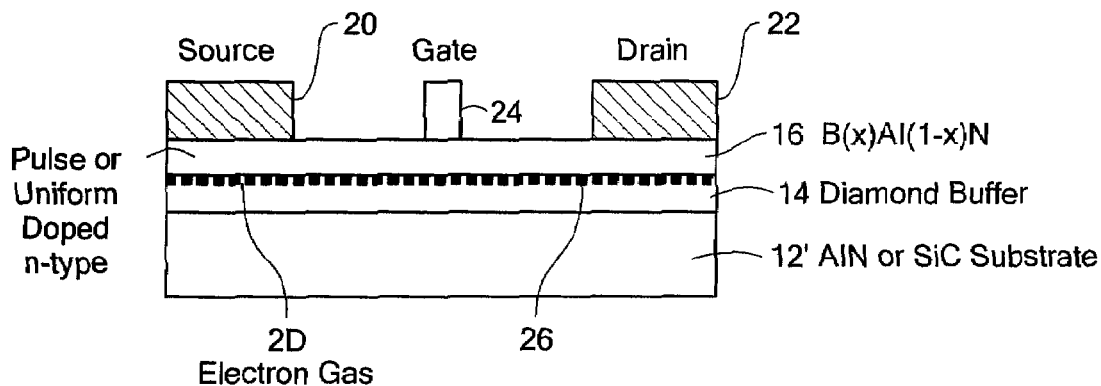
FIG. 2 is a cross-sectional sketch of a B(x)Al(1-x)N/Diamond high electron mobility transistor (HEMT) formed an AlN or SiC substrate with 2D localizations of electrons in the diamond according to another embodiment of the invention.

Thus, FIG. 2 is a sketch of a $B_{(x)}Al_{(1-x)}N$/Diamond heterojunction structure, here a high electron mobility transistor (HEMT), formed an AlN or SiC substrate 12' with 2D localizations of electrons in the diamond buffer layer 14.

Figure 3:
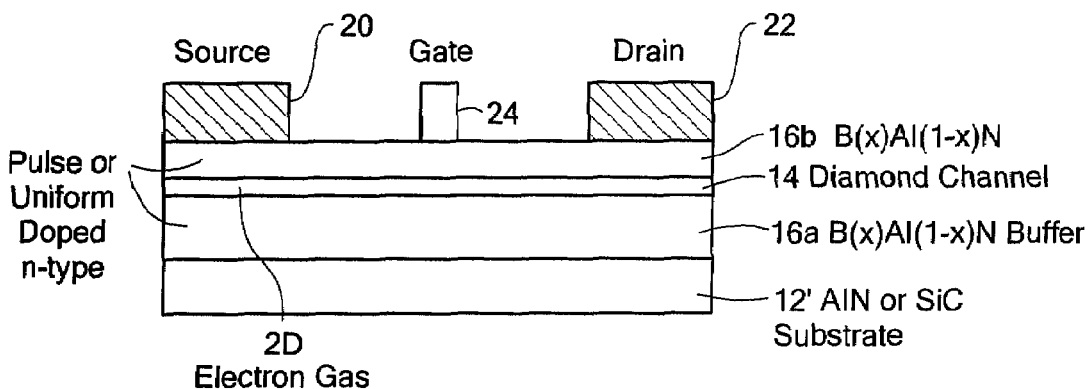
FIG. 3 is a cross-sectional sketch of a B(x)Al(1-x)N/Diamond double heterostructure HEMT formed on a AlN or SiC substrate with 2D localization of electrons in the diamond channel according to the invention.

FIG. 3 is a sketch of a $B_{(x)}Al_{(1-x)}N$/Diamond double heterostructure HEMT formed on a AlN or SiC substrate 12' with 2D localization of electrons in the diamond channel, i.e., layer 14 which is sandwiched between a pair of $B_{(x)}Al_{(1-x)}N$ layers 16a, 16b. Here the $B_{(x)}Al_{(1-x)}N$ layers 16a, 16b are either uniformly n-type doped or n-type pulse doped.

Figure 4:
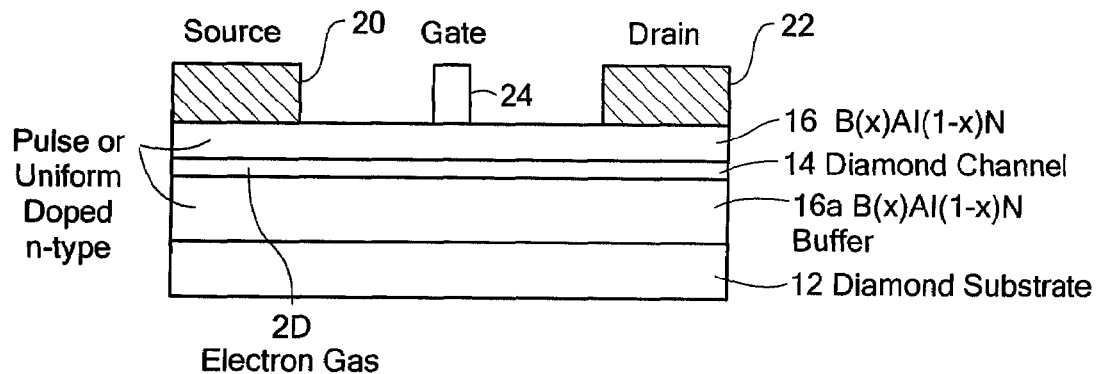
FIG. 4 is a cross-sectional sketch of a B(x)Al(1-x)N/Diamond double heterostructure HEMT formed on a diamond substrate with 2D localization of electrons in a diamond channel according to the invention.

FIG. 4 is a sketch of a $B_{(x)}Al_{(1-x)}N$/Diamond double heterostructure HEMT formed on a diamond substrate 12 with 2D localization of electrons in a diamond channel, i.e., layer 14.

Figure 5:
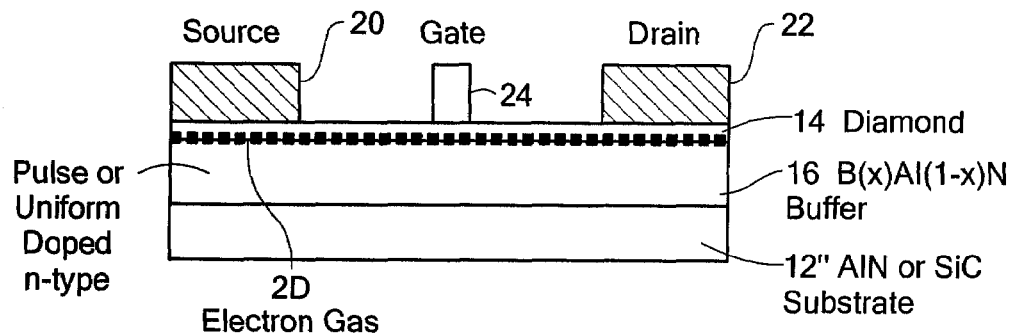
FIG. 5 is a cross-sectional sketch of an Inverted Diamond/B(x)Al(1-x)N HEMT formed on an AlN or SiC substrate, with 2D localization of electrons in the diamond at the Diamond/B(x)Al(1-x)N interface according to the invention.

FIG. 5 is a sketch of an Inverted Diamond/$B_{(x)}Al_{(1-x)}N$ HEMT formed on an AlN or SiC substrate 12', with 2D localization of electrons in the diamond at the Diamond/$B_{(x)}Al_{(1-x)}N$ interface. Here, the $B_{(x)}Al(1-x)N$ layer 16 is epitaxially formed on the substrate 12' and the diamond channel, i.e., layer 14 is formed on the $B_{(x)}Al(1-x)N$ layer 16. Also, the source and drain contacts are formed in ohmic contact with the diamond channel, i.e., layer 14 and the gate contact is formed in Schottky contact with the diamond channel, i.e., layer 14.

Figure 6:
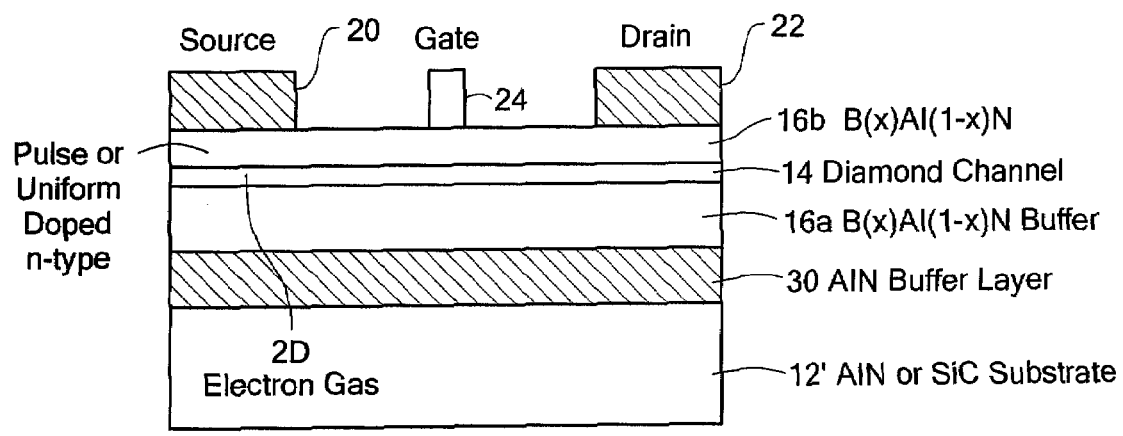
FIG. 6 is a cross-sectional sketch of a B(x)Al(1-x)N/Diamond double heterostructure HEMT formed on a AlN or Silicon Carbide substrate with an additional AlN buffer layer and with 2D localization of electrons in a diamond channel according to the invention.

FIG. 6 is a sketch of a $B_{(x)}Al_{(1-x)}N$/Diamond double heterostructure HEMT formed on a AlN or Silicon Carbide substrate 12' with an additional AlN buffer layer 30 formed on the substrate 12' with the lower $B_{(x)}Al_{(1-x)}N$ layers 16b formed on the AlN layer 30 and with 2D localization of electrons in a diamond channel layer 14.

Figure 7:
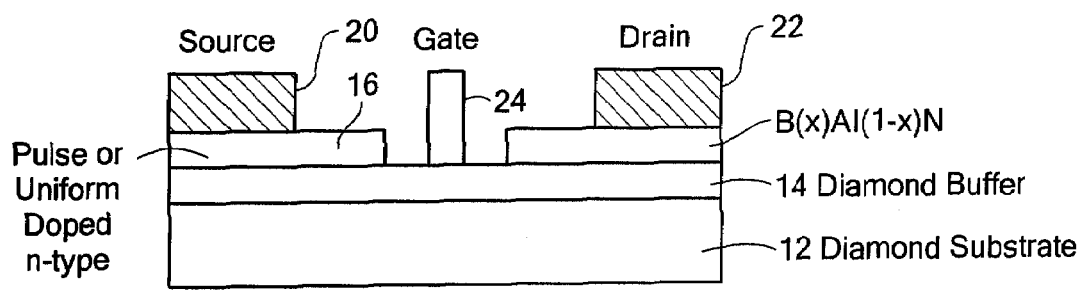
FIG. 7 is a cross-sectional sketch of a recessed gate B(x)Al(1-x)N/Diamond MESFET formed on a diamond substrate according to the invention.

FIG. 7 is a sketch of a recessed gate $B_{(x)}Al_{(1-x)}N$/Diamond MESFET formed on a diamond substrate 12. Here, the gate contact 24 is formed in Schottky contact with the diamond buffer channel layer 14.

A number of embodiments of the invention have been described. Nevertheless, it will be understood that various modifications may be made without departing from the spirit and scope of the invention. For example, other device structures shown in FIGS. 1-7 could also use similar substrates and AlN buffer layer to provide more examples of this type. Accordingly, other embodiments are within the scope of the following claims.

What is claimed is:

1. A field effect transistor, comprising:
  a substrate;
  a diamond layer on the substrate;
  a boron aluminum nitride layer on the diamond layer wherein a boron aluminum nitride—diamond heterojunction is formed between the diamond layer and the boron aluminum nitride layer;
  a source electrode in ohmic contact with the boron aluminum nitride layer;
  a drain electrode in ohmic contact with the boron aluminum nitride layer;
  a gate disposed over the diamond layer between the source electrode and the drain electrode.

2. The field effect transistor recited in claim 1 wherein the gate is in Schottky contact with the diamond layer.

3. The field effect transistor recited in claim 1 wherein the boron aluminum nitride layer is on (111) diamond.

4. The field effect transistor recited in claim 3 wherein the diamond appears as a hexagonal lattice.

5. The field effect transistor recited in claim 4 wherein the effective diamond lattice constant of the hexagonal net of carbon atoms is 2.52 Angstroms, where A is the lattice constant of diamond.

* * * * *

UNITED STATES PATENT AND TRADEMARK OFFICE
CERTIFICATE OF CORRECTION

| | |
|---|---|
| PATENT NO. | : 7,557,378 B2 |
| APPLICATION NO. | : 11/557514 |
| DATED | : July 7, 2009 |
| INVENTOR(S) | : LaRoche et al. |

Page 1 of 1

It is certified that error appears in the above-identified patent and that said Letters Patent is hereby corrected as shown below:

In the Specification

Col. 1, line 15-16, delete "semi-conductors" and replace with -- semi-conductor --.

Col. 1, line 63, delete "diamond" and replace with -- diamond. --.

Col. 2, line 14, delete "formed an" and replace with -- formed on an --.

Col. 3, line 29, delete "In table" and replace with -- In the table --.

Col. 4, line 25, delete "valleys based" and replace with -- valleys are based --.

Col. 5, line 34, delete "which would" and replace with -- would --.

Col. 5, line 62, delete "n type" and replace with -- n-type --.

Col. 6, line 26, delete "piezo-electric" and replace with -- piezoelectric --.

Col. 6, line 27-28, delete "carries" and replace with -- carriers --.

Col. 6, line 31, delete "carries" and replace with -- carriers --.

Col. 6, line 41, delete "structures on" and replace with -- structures can be fabricated on --.

Col. 6, line 48, delete "formed an" and replace with -- formed on an --.

Col. 7, line 18-19, delete "and AIN" and replace with -- and an AIN --.

Signed and Sealed this
Twenty-fifth Day of March, 2014

Michelle K. Lee
*Deputy Director of the United States Patent and Trademark Office*